US012648397B2

(12) United States Patent
Lee et al.

(10) Patent No.: US 12,648,397 B2
(45) Date of Patent: Jun. 2, 2026

(54) DUMMY PANEL TRANSPORT APPARATUS AND DUMMY PANEL TRANSPORT METHOD USING THE SAME

(71) Applicant: Samsung Display Co., Ltd., Yongin-si (KR)

(72) Inventors: Kang-Hyuk Lee, Yongin-si (KR); Eun Su Jun, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 840 days.

(21) Appl. No.: 18/081,025

(22) Filed: Dec. 14, 2022

(65) Prior Publication Data

US 2023/0215748 A1 Jul. 6, 2023

(30) Foreign Application Priority Data

Jan. 5, 2022 (KR) ........................ 10-2022-0001747

(51) Int. Cl.
| | |
|---|---|
| *B25B 11/00* | (2006.01) |
| *B65G 19/00* | (2006.01) |
| *B65G 25/08* | (2006.01) |
| *B65G 47/91* | (2006.01) |
| *B65G 49/06* | (2006.01) |
| *H01L 21/673* | (2006.01) |
| *H01L 21/683* | (2006.01) |

(52) U.S. Cl.
CPC .......... *H01L 21/6734* (2013.01); *B65G 19/00* (2013.01); *B65G 25/08* (2013.01); *B65G 47/911* (2013.01); *B65G 49/064* (2013.01); *H01L 21/6838* (2013.01); *B65G 2201/022* (2013.01)

(58) Field of Classification Search
CPC ......... B25B 11/00; B25B 11/005; B23Q 3/00; B23Q 3/06; B23Q 3/154
See application file for complete search history.

(56) References Cited

U.S. PATENT DOCUMENTS

| | | | | |
|---|---|---|---|---|
| 3,977,037 A | * | 8/1976 | Miyake ................. | A47L 9/0027 |
| | | | | 254/382 |
| 2010/0052832 A1 | * | 3/2010 | Wang ..................... | B23Q 3/154 |
| | | | | 335/291 |
| 2021/0197329 A1 | * | 7/2021 | Liu .......................... | B23Q 3/06 |
| 2023/0215748 A1 | * | 7/2023 | Lee ........................ | B65G 25/08 |
| | | | | 414/752.1 |

FOREIGN PATENT DOCUMENTS

KR 1020220158180 A 11/2022

* cited by examiner

*Primary Examiner* — Lee D Wilson
(74) *Attorney, Agent, or Firm* — CANTOR COLBURN LLP

(57) ABSTRACT

A dummy panel transport apparatus includes: an adsorption unit including an injection hole into which compressed air is injected, a discharge hole to which the compressed air is discharged, and a suction hole in which an external air is sucked; an adsorption unit holder supporting the adsorption unit, and movable in a first direction and a direction opposite to the first direction; a plate disposed under the adsorption unit holder; a plate holder supporting the plate, and movable in a second direction crossing the first direction and in a direction opposite to the second direction; a dummy storage part disposed under the plate; a brush unit disposed on the plate; and a brush unit holder supporting the brush unit, and movable in the first direction, in the direction opposite to the first direction, in the second direction, and the direction opposite to the second direction.

20 Claims, 14 Drawing Sheets

DUMMY PANEL TRANSPORT APPARATUS AND DUMMY PANEL TRANSPORT METHOD USING THE SAME

This application claims priority to Korean Patent Application No. 10-2022-0001747, filed on Jan. 5, 2022, and all the benefits accruing therefrom under 35 U.S.C. § 119, the content of which in its entirety is herein incorporated by reference.

BACKGROUND

Field

Implementations of the invention relate generally to a dummy panel transport apparatus used in a manufacturing process of a display device and dummy panel transport method using the dummy panel transport apparatus.

Discussion of the Background

A display device is a device for displaying an image. The display device may include a display panel including electric components for displaying the image.

A manufacturing process of the display panel included in the display device may include forming a plurality of cells including the display panel and a dummy panel in a mother substrate having a relatively large rea, and cutting the mother substrate. In this case, a dummy panel transport apparatus may be desirable to remove and transport the dummy panel separated from the display panel.

SUMMARY

Embodiments provide a dummy panel transport apparatus that facilitates transport of a dummy panel.

Embodiments provide a dummy panel transport method using the dummy panel transport apparatus.

A dummy panel transport apparatus according to an embodiment includes: an adsorption unit including an injection hole into which compressed air is injected, a discharge hole to which the compressed air is discharged, and a suction hole in which an external air is sucked, where the injection hole is defined in a frame provided in a flow path between the discharge hole and the suction hole; an adsorption unit holder, which supports the adsorption unit, and is movable in a first direction and a direction opposite to the first direction; a plate disposed under the adsorption unit holder; a plate holder, which supports the plate, and is movable in a second direction crossing the first direction and in a direction opposite to the second direction; a dummy storage part disposed under the plate, and spaced apart from the adsorption unit holder in the direction opposite to the second direction; a brush unit disposed on the plate; and a brush unit holder, which supports the brush unit, and is movable in the first direction, in the direction opposite to the first direction, in the second direction, and in the direction opposite to the second direction.

According to an embodiment, the frame may have a first inner diameter in a first area adjacent to the injection hole, a second inner diameter in a second area adjacent to the discharge hole, and a third inner diameter in a third area between the first area and the second area, wherein the third inner diameter may be smaller than each of the first inner diameter and the second inner diameter.

According to an embodiment, an inner diameter of the frame may gradually change from the first inner diameter to the third inner diameter, from the first area to the third area, and the inner diameter of the frame may gradually change from the third inner diameter to the second inner diameter, from the third area to the second area According to an embodiment, the frame may have a fourth inner diameter in a fourth area adjacent to the suction hole, and a fifth inner diameter in a fifth area between the first area and the fourth area, wherein the fifth inner diameter may be smaller than each of the first inner diameter and the fourth inner diameter.

According to an embodiment, an inner diameter of the frame may gradually change from the first inner diameter to the fifth inner diameter, from the first area to the fifth area.

According to an embodiment, the fifth inner diameter may be smaller than the third inner diameter.

According to an embodiment, the adsorption unit may further include an adsorption pad combined with the suction hole.

According to an embodiment, an inner diameter of the adsorption pad may gradually decrease in a direction toward the suction hole.

According to an embodiment, an inner diameter of the adsorption pad adjacent to the suction hole may be smaller than an inner diameter of the suction hole.

According to an embodiment, Young's modulus of the adsorption pad may be equal to or more than 0.01 gigapascals (GPa) and equal to or less than 5 GPa.

According to an embodiment, the plate may define a plurality of grooves therein recessed in the first direction, extending in the second direction, and arranged in a third direction crossing the first direction and the second direction.

According to an embodiment, the brush unit may include a plurality of protrusion parts protruding in the first direction corresponding to the plurality of grooves.

According to an embodiment, a width of the dummy storage part in the second direction may be larger than a width of the plate in the second direction.

A dummy panel transport method according to an embodiment includes: disposing a display panel and a dummy panel adjacent to at least one side of the display panel under a suction hole of an adsorption unit, where the adsorption unit comprises an injection hole into which compressed air is injected, a discharge hole to which the compressed air is discharged, and the suction hole in which an external air is sucked, wherein the injection hole is defined in a frame provided in a flow path between the discharge hole and the suction hole; disposing the suction hole adjacent to the dummy panel by moving an adsorption unit holder supporting the adsorption unit in a first direction; adsorbing the dummy panel by injecting the compressed air into the injection hole; moving the adsorption unit holed in a direction opposite to the first direction; disposing a plate under the adsorbed dummy panel by moving a plate holder supporting the plate in a second direction crossing the first direction; moving the dummy panel on the plate by stopping the adsorption of the dummy panel; moving the plate on a dummy storage part by moving the plate holder in a direction opposite to the second direction; and moving the dummy panel in the dummy storage part.

According to an embodiment, the moving of the dummy panel in the dummy storage part may include: moving a brush unit holder supporting a brush unit to dispose the brush unit on one side of the plate; disposing the brush unit adjacent to the one side of the plate by moving the brush unit in the first direction; and pushing the dummy panel in the direction opposite to the second direction by moving the brush unit holder in the direction opposite to the second direction.

According to an embodiment, the plate may define a plurality of grooves therein recessed in the first direction, extending in the second direction, and arranged in a third direction crossing the first direction and the second direction, and the brush unit may include a plurality of protrusion parts protruding in the first direction corresponding to the plurality of grooves According to an embodiment, in the disposing of the brush unit adjacent to the one side of the plate, the plurality of protrusion parts of the brush unit may be inserted into the plurality of grooves of the plate.

According to an embodiment, the moving of the plate on the dummy storage part and the moving of the dummy panel in the dummy storage part may be performed simultaneously.

According to an embodiment, in the disposing of the suction hole adjacent to the dummy panel, the dummy panel may be spaced apart from the suction hole, and the suction hole is disposed to face the dummy panel.

According to an embodiment, the dummy panel may be provided in plural, and in the adsorbing of the dummy panel by injecting the compressed air into the injection hole, the suction hole may simultaneously adsorb at least two of the dummy panels.

A dummy panel transport apparatus according to an embodiment may include an adsorption unit including an injection hole into which compressed air is injected, a discharge hole to which the compressed air is discharged, and a suction hole in which an external air is sucked, wherein the injection hole is defined in a frame provided in a flow path between the discharge hole and the suction hole. Accordingly, the compressed air may be injected into the injection hole so that the pressure of the suction hole may be relatively low, and the dummy panel may be adsorbed to the suction hole.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 11 is a diagram illustrating the plate part and the brush part included in the dummy panel transport apparatus of FIG. 2 as view from a second direction.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Illustrative, non-limiting embodiments will be more clearly understood from the following detailed description in conjunction with the accompanying drawings.

Figure 1:
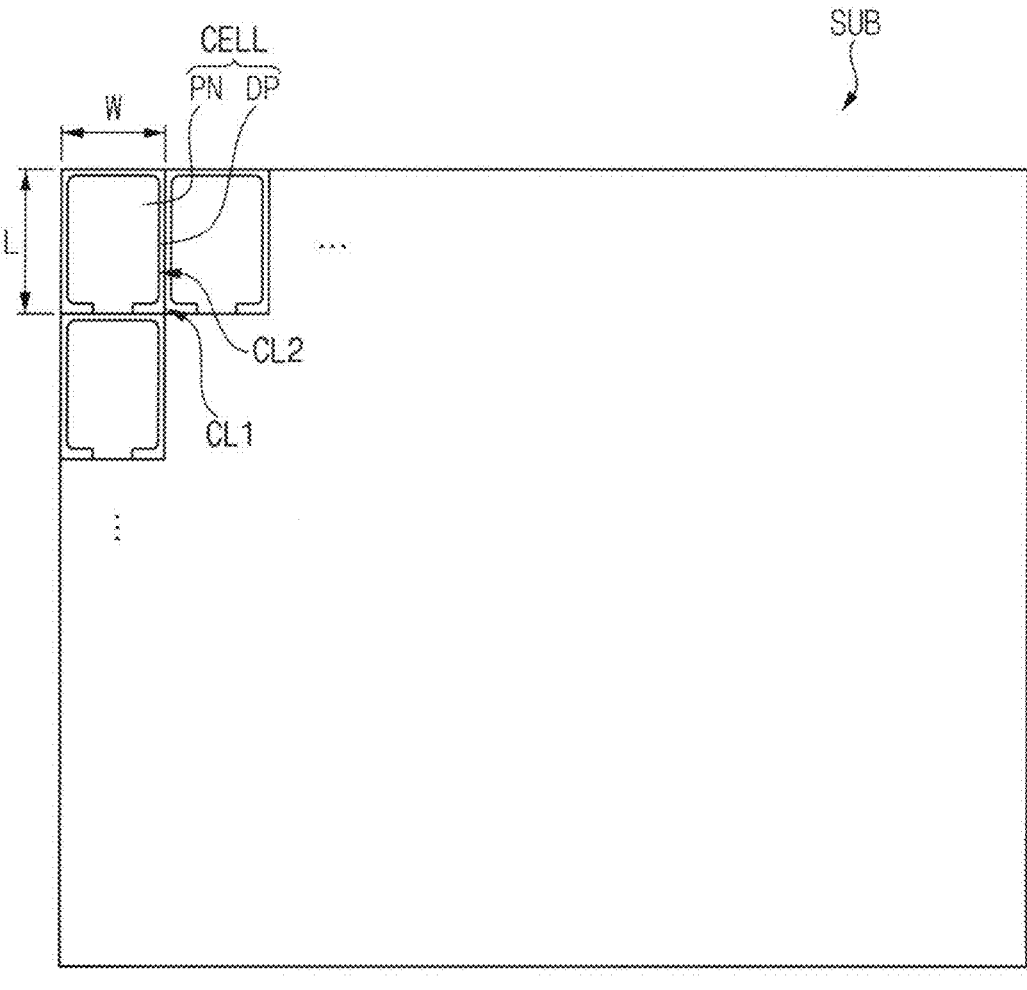
FIG. 1 is a plan view illustrating a display panel and a dummy panel according to an embodiment.
Figure 1:
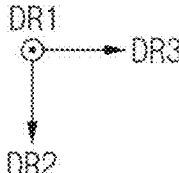

FIG. 1 is a plan view illustrating a display panel and a dummy panel according to an embodiment.

Referring to FIG. 1, a mother substrate SUB including a plurality of cells CELL may be provided to form a display device.

The mother substrate SUB may include a base substrate. The base substrate may include a material having relatively high rigidity. In an embodiment, the base substrate may include a material having flexibility, and accordingly, the base substrate may have a flexible property.

The plurality of cells CELL may be arranged in a second direction DR2 and a third direction DR3 crossing the second direction DR2 to be adjacent each other.

Each of the plurality of cells CELL may include a display panel PN and a dummy panel DP.

The display panel PN may display an image by receiving an electrical signal. In an embodiment, the display panel PN may include a conductive pattern, a transistor, a light emitting element, etc., and the conductive pattern, the transistor, and the light emitting element may be formed on the base substrate.

The dummy panel DP may be adjacent to at least one side of the display panel PN. In an embodiment, the dummy panel DP may include an inspection pattern for inspecting the display panel PN. For example, the dummy panel DP may include an alignment inspection pattern for inspecting an alignment of the conductive pattern included in the display panel PN.

In a manufacturing process of the display device, each of the plurality of cells CELL may be separated from each other. For example, the mother substrate SUB may be irradiated with laser along a first cutting line CL1 between two adjacent cells among the plurality of cells CELL, and accordingly, the plurality of cells CELL may be separated from each other.

In the manufacturing process of the display device, the display panel PN and the dummy panel DP may be separated from each other. For example, each of the plurality of cells may be irradiated with laser along a second cutting line CL2 which is a boundary between the display panel PN and the dummy panel DP, and accordingly, the display panel PN and the dummy panel DP may be separated from each other.

After separating the display panel PN from the dummy panel DP, a process for removing the dummy panel DP adjacent to the display panel PN may be performed.

Figure 2:
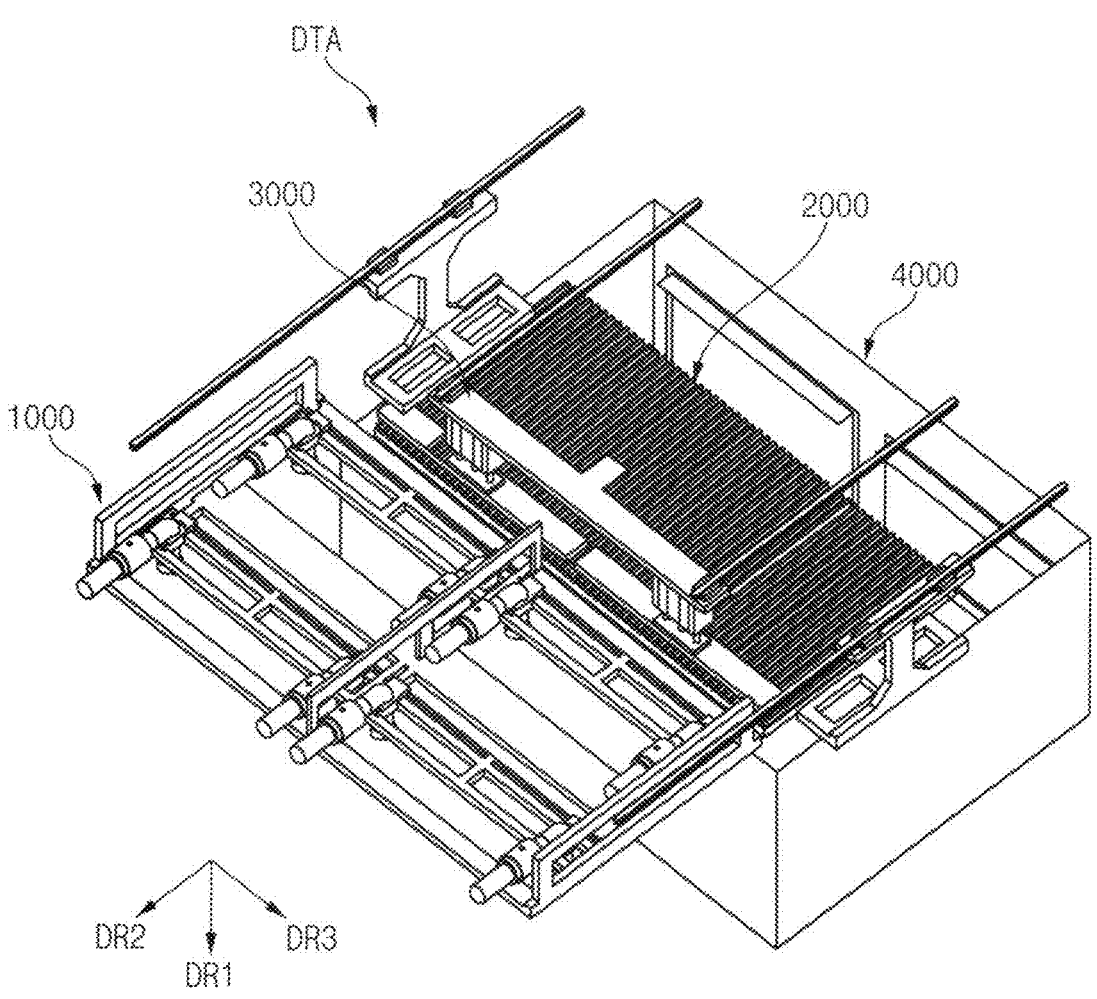
FIG. 2 is a perspective view illustrating a dummy panel transport apparatus according to an embodiment.

FIG. 2 is a perspective view illustrating a dummy panel transport apparatus according to an embodiment.

Referring to FIG. 2, a dummy panel transport apparatus DTA according to an embodiment may include an adsorption part 1000, a plate part 2000, a brush part 3000, and a dummy storage part 4000.

The adsorption part 1000 may adsorb the dummy panel DP. For example, a stage (not shown) may be disposed under the adsorption part 1000. The adsorption part 1000 may move in a first direction DR1 crossing the second direction DR2 and the third direction DR3 to adsorb the dummy panel, and then may move in a direction opposite to the first direction DR1.

The plate part 2000 may be disposed under the adsorption part 1000. The plate part 2000 may transport the dummy panel DP adsorbed to the adsorption part 1000. For example, when the adsorption part 1000 adsorbs the dummy panel DP and moves in the direction opposite to the first direction DR1, the plate part 2000 may move in the second direction DR2 and may be disposed under the dummy panel DP adsorbed to the adsorption part 1000. In this case, when the adsorption part 1000 stops adsorption of the dummy panel DP, the dummy panel DP may be accommodated on the plate part 2000. The plate part 2000 may move in a direction opposite to the second direction DR2 after accommodating the dummy panel DP.

The brush part 3000 may be disposed on the plate part 2000. The brush part 3000 may push the dummy panel DP accommodated in the plate part 2000 in the direction opposite to the second direction DR2. Accordingly, the dummy panel DP may move from above the plate part 2000 into the dummy storage part 4000 disposed under the plate part 2000.

The dummy storage part 4000 may accommodate the dummy panel DP. The dummy storage part 4000 may have an inner space for accommodating the dummy panel DP.

Figure 3:
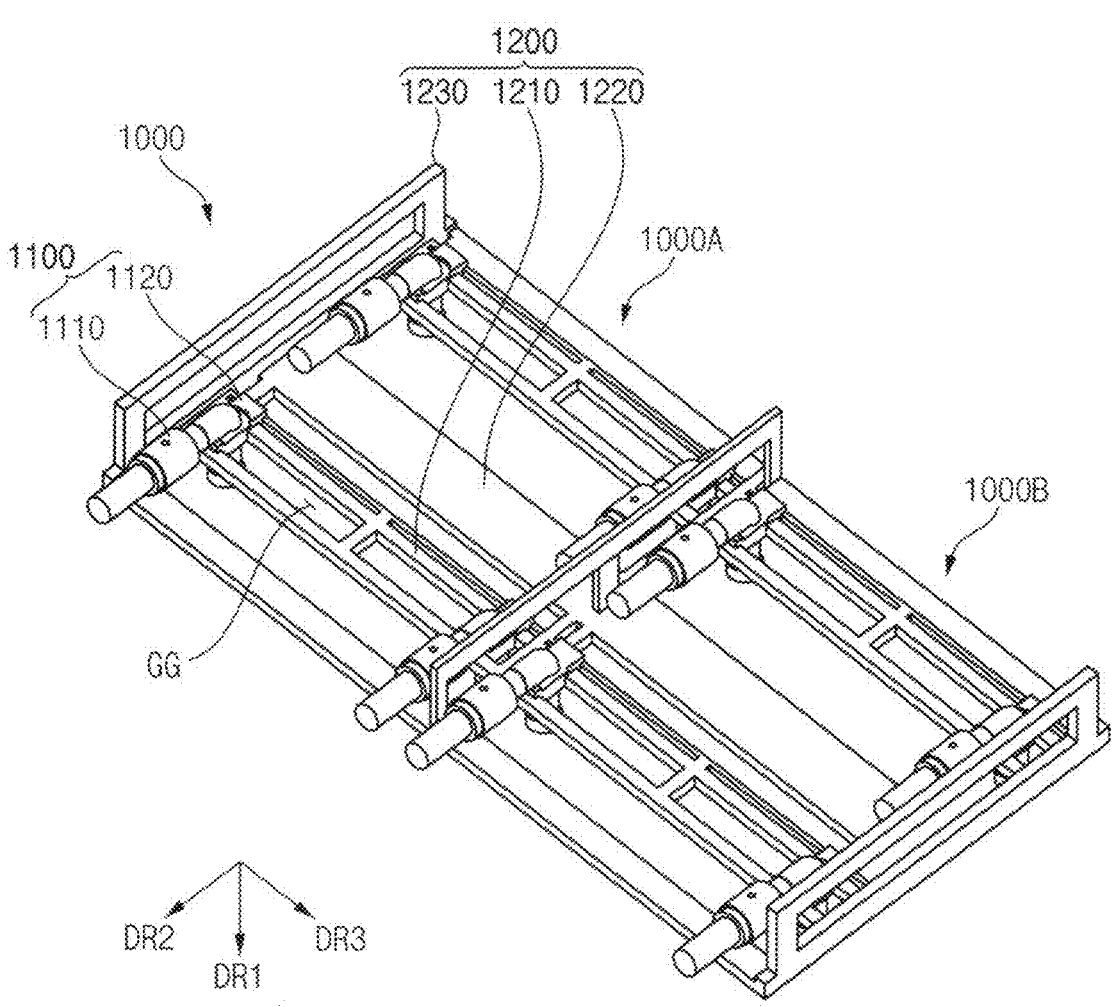
FIG. 3 is a perspective view illustrating an adsorption part included in the dummy panel transport apparatus.

FIG. 3 is a perspective view illustrating an adsorption part included in the dummy panel transport apparatus.

Referring to FIG. 3, the adsorption part 1000 may include a first adsorption part 1000A and a second adsorption part 1000B. Each of the first adsorption part 1000A and the second adsorption part 1000B may include an adsorption unit 1100 and an adsorption unit holder 1200. The adsorption unit 1100 may include an adsorption member 1110 and an adsorption member holder 1120, and the adsorption unit holder 1200 may include an adsorption unit moving part 1210, a first frame 1220, and a second frame 1230.

The adsorption member 1110 may adsorb the dummy panel DP. The adsorption member 1110 will be described later with reference to FIG. 4 and FIG. 5.

The adsorption member holder 1120 may be combined with the adsorption member 1110 and the adsorption unit moving part 1210. In an embodiment, the adsorption member holder 1120 may move in the third direction DR3 and in a direction opposite to the third direction DR3 along a guide groove GG defined in the adsorption unit moving part 1210. Accordingly, a distance between the two adsorption members 1110 adjacent to each other in the third direction DR3 may be adjusted to correspond to a width W of the dummy panel DP in the third direction DR3.

The adsorption unit moving part 1210 may be combined with the adsorption member holder 1120. The guide groove GG may be defined in the adsorption unit moving part 1210 along the third direction DR3.

The first frame 1220 and the second frame 1230 may be combined with the adsorption unit moving part 1210. In an embodiment, the adsorption unit moving part 1210 may move in the second direction DR2 and the direction opposite to the second direction DR2 along a guide groove formed in the first frame 1220 and the second frame 1230. Accordingly, a distance between the two adjacent adsorption members 1110 adjacent to each other in the second direction DR2 may be adjusted to correspond to a height L of the dummy panel DP in the second direction DR2.

FIG. 3 illustrates an embodiment in which each of the first adsorption part 1000A and the second adsorption part 1000B includes four adsorption units 1100. The four adsorption units 1100 included in each of the first adsorption part 1000A and the second adsorption part 1000B may adsorb one dummy panel DP together. Accordingly, the adsorption part 1000 may adsorb two dummy panels DP at the same time.

Figure 4:
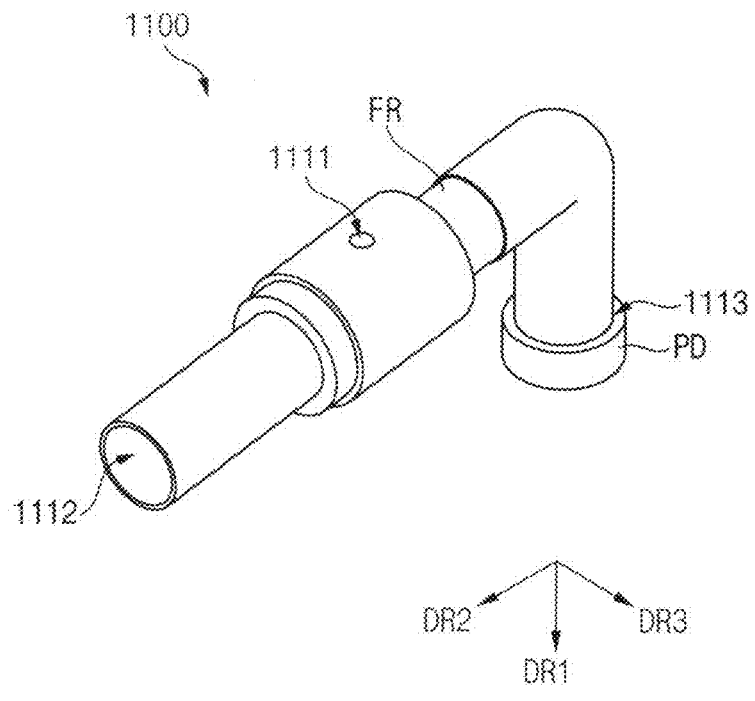
FIG. 4 is a perspective view illustrating an adsorption unit included in the adsorption part of FIG. 3.

FIG. 4 is a perspective view illustrating an adsorption unit included in the adsorption part of FIG. 3. For convenience of description, the adsorption member holder 1120 is omitted in FIG. 4.

Referring to FIG. 4, the adsorption unit 1100 may include a frame FR and an adsorption pad PD. An injection hole 1111, a discharge hole 1112, and a suction hole 1113 may be defined in the frame FR.

The frame FR may be provided in a flow path between the suction hole 1113 and the discharge hole 1112. In other words, one end of the frame FR may be the suction hole 1113, and other end opposite to the one end may be the discharge hole 1112. The frame FR may have a tube shape having an inner diameter, and may be bent in at least one area. In an embodiment, the inner diameter of the frame FR may not be constant. This will be described later with reference to FIG. 5.

Compressed air having a relatively high pressure may be injected into the injection hole 1111. The injection hole 1111 may be defined in the frame FR between the suction hole 1113 and the discharge hole 1112. The compressed air injected into the injection hole 1111 may be discharged through the discharge hole 1112. In this case, pressure of the suction hole 1113 may be relatively lowered, and the suction hole 1113 may suck in external air.

The adsorption pad PD may be combined with the one end of the frame FR. When the dummy panel DP is adsorbed to the adsorption unit 1100, the adsorption pad PD may directly contact the dummy panel DP. The adsorption pad PD may include a material having relatively low rigidity. In an embodiment, the adsorption pad PD may include a material having a Young's modulus of equal to or more than about 0.01 GPa and equal to or less than about 5 GPa.

Figure 5:
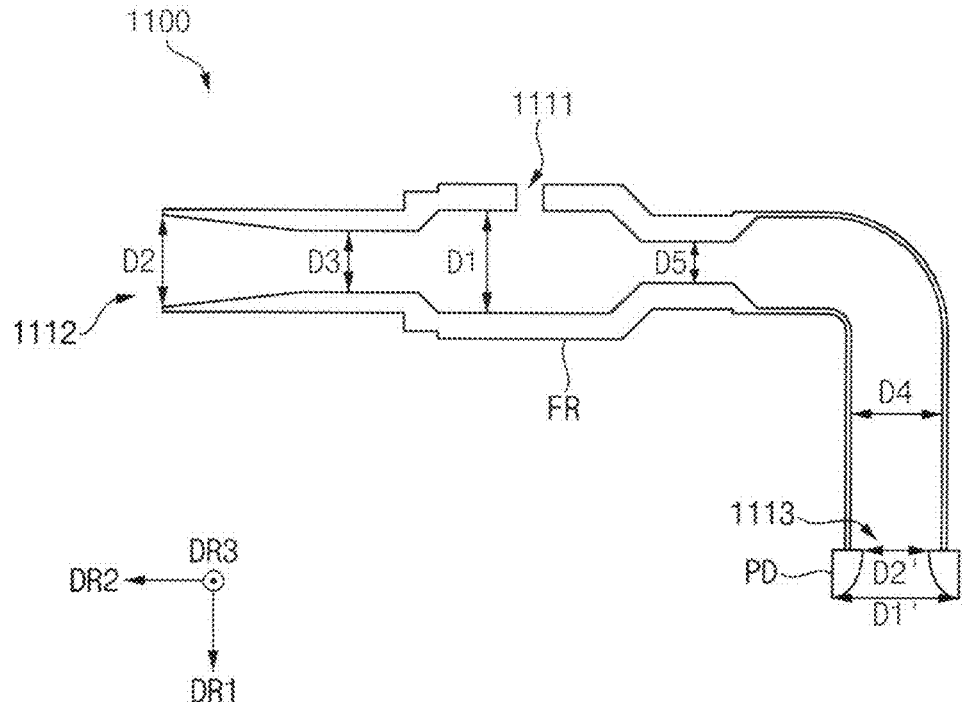
FIG. 5 is a cross-sectional view of the adsorption unit of FIG. 4.

FIG. 5 is a cross-sectional view of the adsorption unit of FIG. 4. FIG. 5 may be a cross-sectional view illustrating the adsorption unit of FIG. 4 as viewed from the third direction DR3.

Referring to FIG. 5, the frame FR may have a first inner diameter D1, a second inner diameter D2, a third inner diameter D3, a fourth inner diameter D4, and a fifth inner diameter D5. Specifically, the frame FR may have the first inner diameter D1 in an area adjacent to the injection hole 111, and the frame FR may have the second inner diameter D2 in an area adjacent to the discharge hole 1112, and the frame FR may have the third inner diameter D3 in an area between the injection hole 1111 and the discharge hole 1112, and the frame FR may have the fourth inner diameter D4 in an area adjacent to the suction hole 1113, and the frame FR may have the fifth inner diameter D5 in an area between the injection hole 1111 and the suction hole 1113.

In an embodiment, the third inner diameter D3 may be greater than the fifth inner diameter D5. Accordingly, the compressed air injected into the injection hole 1111 may flow toward the discharge hole 1112 and may be discharged through the discharge hole 1112. In this case, pressure of the suction hole 1113 may be relatively lowered.

In an embodiment, the third inner diameter D3 may be smaller than the first inner diameter D1, and may be smaller than the second inner diameter D2. In this case, the inner diameter of the frame FR may gradually change (e.g., decrease) from the first inner diameter D1 to the third inner diameter D3, and may gradually change (e.g., increase) from the third inner diameter D3 to the second inner diameter D2 in the second direction DR2. Accordingly, when the compressed air injected into the injection hole 1111 flows to the discharge hole 1112, flow rate of the compressed air may change in an area where the inner diameter of the frame FR changes in the second direction DR2.

In an embodiment, the fifth inner diameter D5 may be smaller than the first inner diameter D1, and may be smaller than the fourth inner diameter D4. In this case, the inner diameter of the frame FR may gradually change (e.g., decrease) from the first inner diameter D1 to the fifth inner diameter D5, and may gradually change (e.g., increase) from the fifth inner diameter D5 to the fourth inner diameter D4 in a route from the injection hole 1111 to the suction hole 1113.

An inner diameter of the adsorption pad PD may gradually decrease in the direction (for example, the direction opposite to the first direction DR1) toward the suction hole 1113. In an embodiment, the inner diameter of the adsorption pad PD may gradually change (e.g., decrease) from a first pad diameter D1' to the second pad diameter D2' smaller than the first pad diameter D1'. In this case, the second pad diameter D2' may be smaller than the fourth inner diameter D4.

Figure 6:
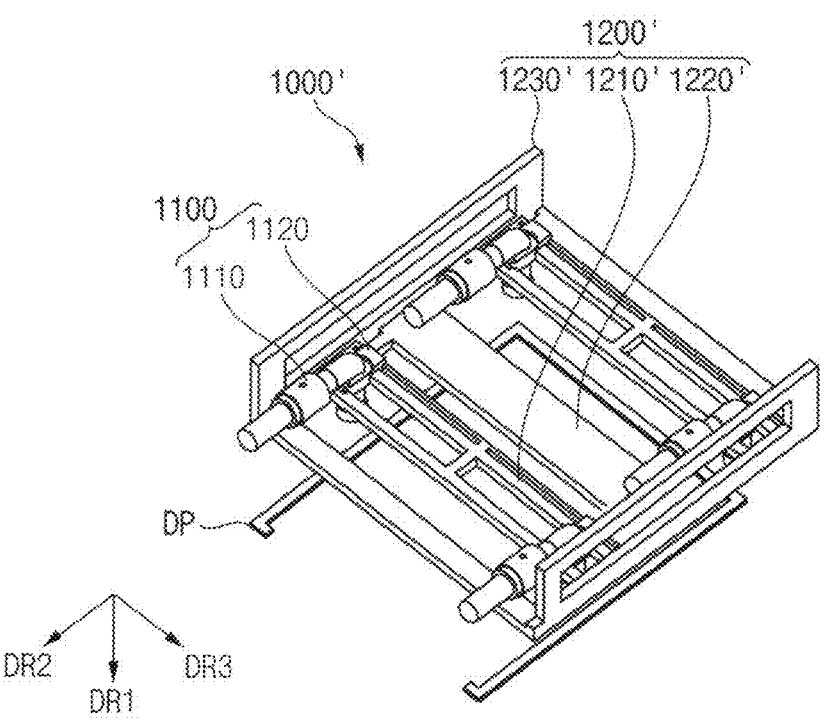
FIG. 6 is a perspective view illustrating an adsorption part according to another embodiment.

FIG. 6 is a perspective view illustrating an adsorption part according to another embodiment.

Referring to FIG. 6, an adsorption part 1000' may include the adsorption unit 1100 and an adsorption unit holder 1200'. The adsorption unit 1100 may include the adsorption member 1110 and the adsorption member holder 1120, and the adsorption unit 1100 may be substantially same as the adsorption unit 1100 described with reference to FIG. 3, FIG. 4, and FIG. 5. The adsorption unit holder 1200' may include an adsorption unit moving part 1210', a first frame 1120', and the second frame 1230'.

The adsorption unit moving part 1210' may be combined with the adsorption member holder 1120. A guide groove may be defined in the adsorption unit moving part 1210' along the third direction DR3. The adsorption member holder 1120 may move in the third direction DR3 and the direction opposite to the third direction DR3 along the guide groove, and accordingly, a distance between two adsorption members 1110 adjacent to each other in the third direction DR3 may be adjusted to correspond to the width W of the dummy panel DP in the third direction DR3.

The first frame 1220' and the second frame 1230' may be combined with the adsorption unit moving part 1210'. In an embodiment, the adsorption unit moving part 1210' may move in the second direction DR2 and the direction opposite to the second direction DR2 along a guide groove formed in the first frame 1220' and the second frame 1230'. Accordingly, a distance between the two adsorption members 1110 adjacent to each other in the second direction DR2 may be adjusted to correspond to the height L of the dummy panel DP in the second direction DR2.

FIG. 6 illustrates an embodiment in which the adsorption part 1000' includes four adsorption units 1100. The four adsorption units 1100 included in the adsorption part 1000' may adsorb one dummy panel DP together. Accordingly, the adsorption part 1000' may adsorb one dummy panel DP.

Figure 7:
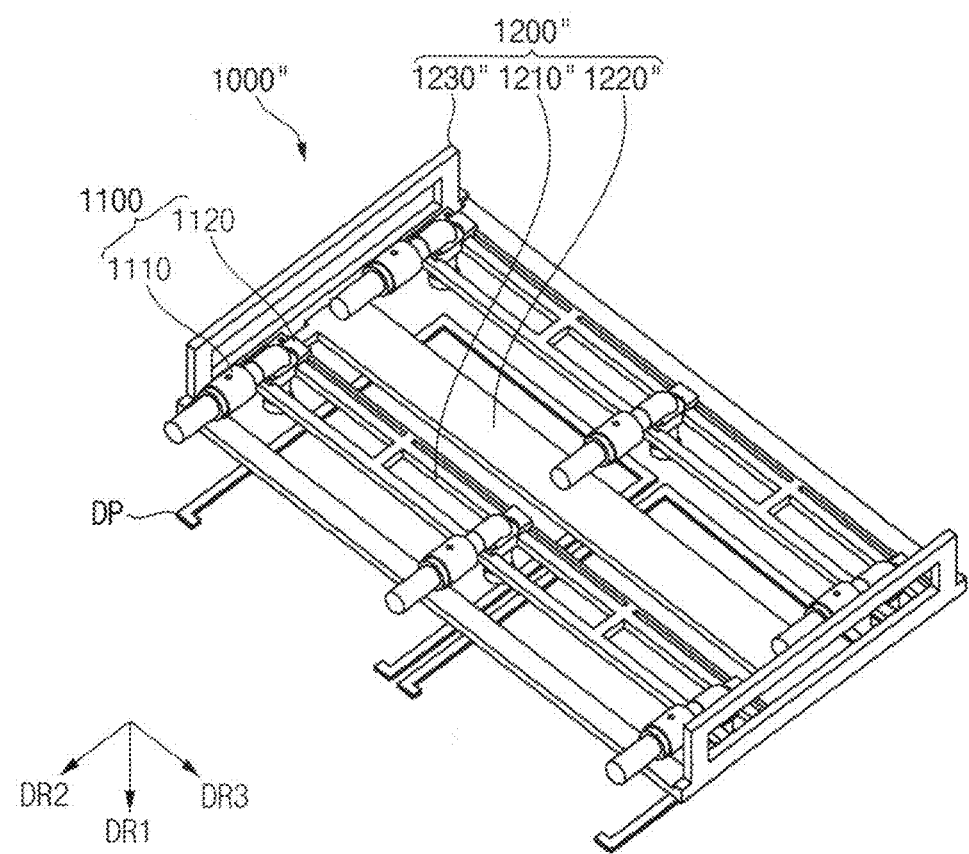
FIG. 7 is a perspective view illustrating an adsorption part according to still another embodiment.
Figure 8:
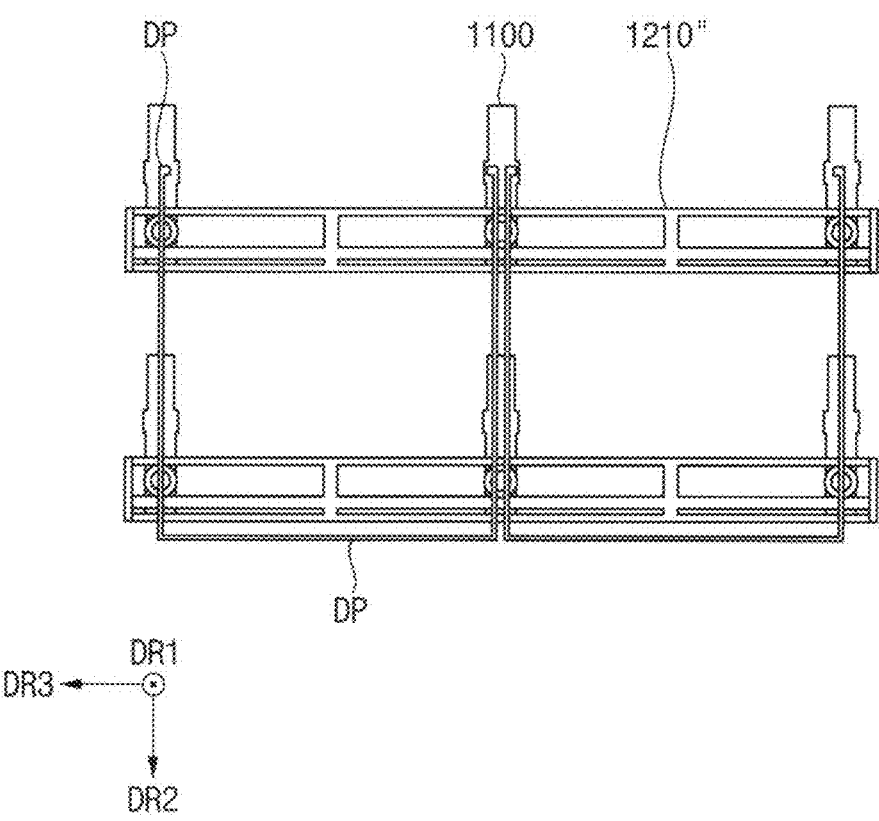
FIG. 8 is a diagram illustrating an adsorption part of FIG. 7 as viewed from a first direction.

FIG. 7 is a perspective view illustrating an adsorption part according to still another embodiment. FIG. 8 is a diagram illustrating an adsorption part of FIG. 7 as viewed from a first direction.

Referring to FIG. 7 and FIG. 8, an adsorption part 1000'' may include the adsorption unit 1100 and an adsorption unit holder 1200''. The adsorption unit 1100 may include the adsorption member 1110 and the adsorption member holder 1120, and may be substantially same as the adsorption unit 1100 described with reference to FIG. 3, FIG. 4, and FIG. 5. The adsorption unit holder 1200'' may include an adsorption unit moving part 1210'', a first frame 1220'', and a second frame 1230''.

The adsorption unit moving part 1210'' may be combined with the adsorption member holder 1120. A guide groove may be defined in the adsorption unit moving part 1210'' along the third direction DR3. The adsorption member holder 1120 may move in the third direction DR3 and in the direction opposite to the third direction DR3 along the guide groove. Accordingly, a distance between two adsorption member 1110 adjacent to each other in the third direction DR3 may be adjusted to correspond to the width W of the dummy panel DP in the third direction DR3.

The first frame 1220'' and the second frame 1230'' may be combined with the adsorption unit moving part 1210''. In an embodiment, the adsorption unit moving part 1210'' may move in the second direction DR2 and in the direction opposite to the second direction DR2 along a guide groove defined in the first frame 1220″ and the second frame 1230′. Accordingly, a distance between the two adsorption members 1110 adjacent to each other in the second direction DR2 may be adjusted to correspond to the height L of the dummy panel DP in the second direction DR2.

FIG. 7 and FIG. 8 illustrate an embodiment in which the adsorption part 1000 includes six adsorption units 1100. Two adsorption units 1100 among the six adsorption units 1100 may adsorb two different dummy panels DP at the same time. As such, as two dummy panels DP are simultaneously adsorbed to one adsorption unit 1100, a relatively small number of adsorption units 1100 may adsorb a relatively large number of dummy panels DP at the same time compared to the embodiments in FIGS. 3 and 6.

Figure 9:
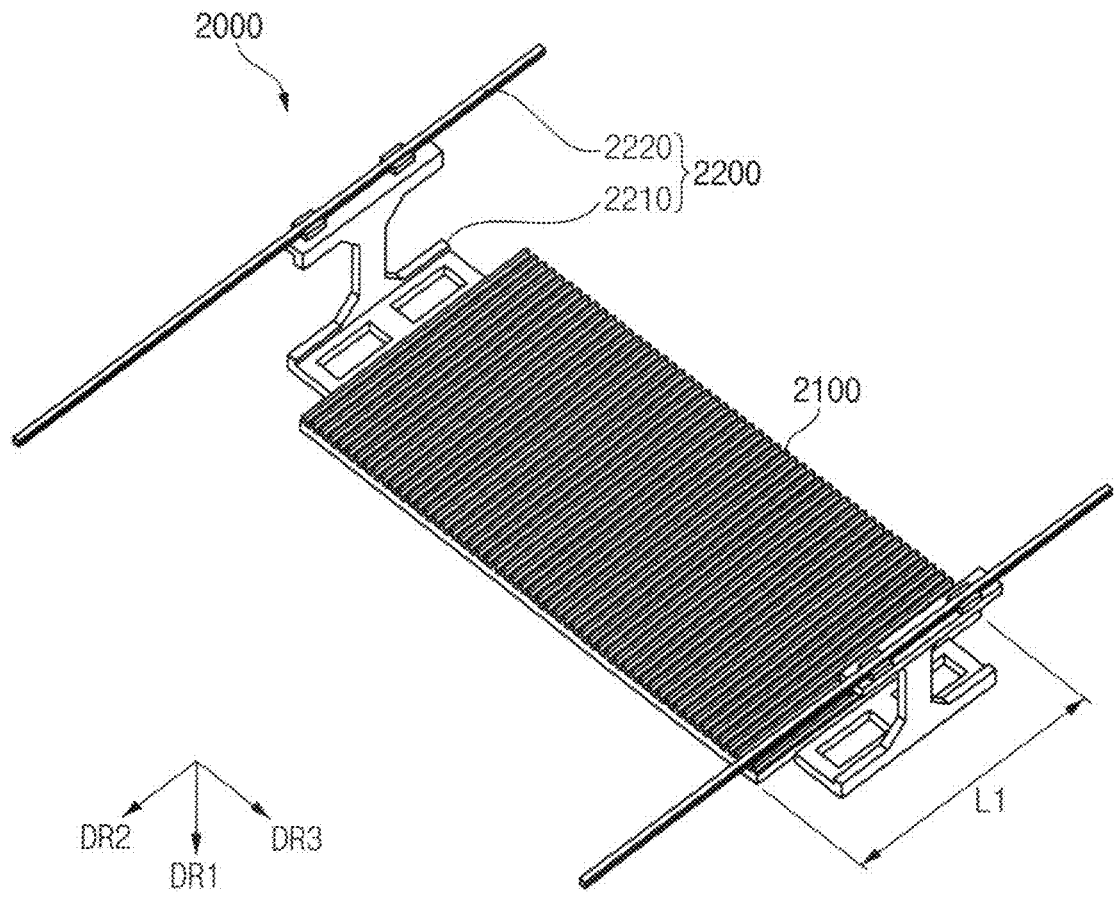
FIG. 9 is a perspective view illustrating a plate included in the dummy panel transport apparatus of FIG. 2.

FIG. 9 is a perspective view illustrating a plate part included in the dummy panel transport apparatus of FIG. 2.

Referring to FIG. 9, the plate part 2000 may include a plate 2100 and a plate holder 2200. The plate holder 2200 may include a plate holding part 2210 and a plate guide 2220.

The plate 2100 may accommodate the dummy panel DP. The plate holding part 2210 may be combined with the plate 2100 and the plate guide 2220. The plate guide 2220 may extend in the second direction DR2. The plate holding part 2210 may move in the second direction DR2 and in the direction opposite to the second direction DR2 along the plate guide 2220, and accordingly, the plate 2100 combined with the plate holding part 2210 may move in the second direction DR2 and the direction opposite to the second direction DR2.

Figure 10:
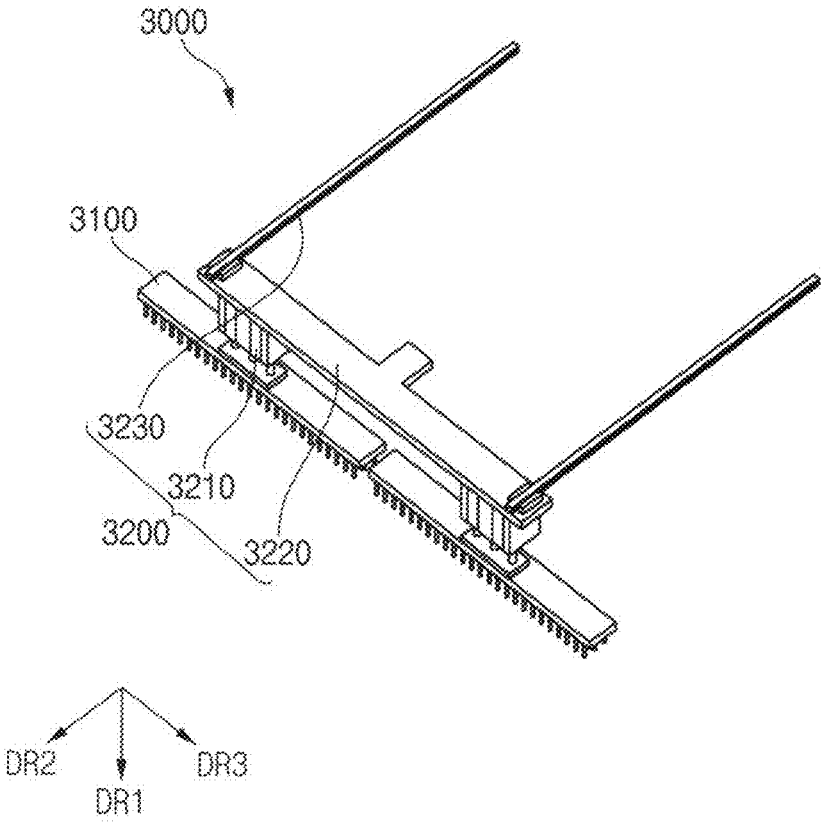
FIG. 10 is a perspective view illustrating a brush part included in the dummy panel transport apparatus of FIG. 2.

FIG. 10 is a perspective view illustrating a brush part included in the dummy panel transport apparatus of FIG. 2.

The brush part 3000 may include a brush unit 3100 and a brush unit holder 3200. The brush unit holder 3200 may include a brush unit adjusting part 3210, a brush unit holding part 3220, and a brush unit guide part 3230.

The brush unit 3100 may be combined with the brush unit adjusting part 3210. The brush unit adjusting part 3210 may move the brush unit 3100 in the first direction DR1 and in the direction opposite to the first direction DR1.

The brush unit adjusting part 3210 may be combined with the brush unit holding part 3220, and the brush unit holding part 3220 may be combined with the brush unit guide part 3230. The brush unit guide part 3230 may extend in the second direction DR2, and the brush unit holding part 3220 may move in the second direction DR2 and the direction opposite to the second direction DR2 along the brush unit guide part 3230.

Figure 11:
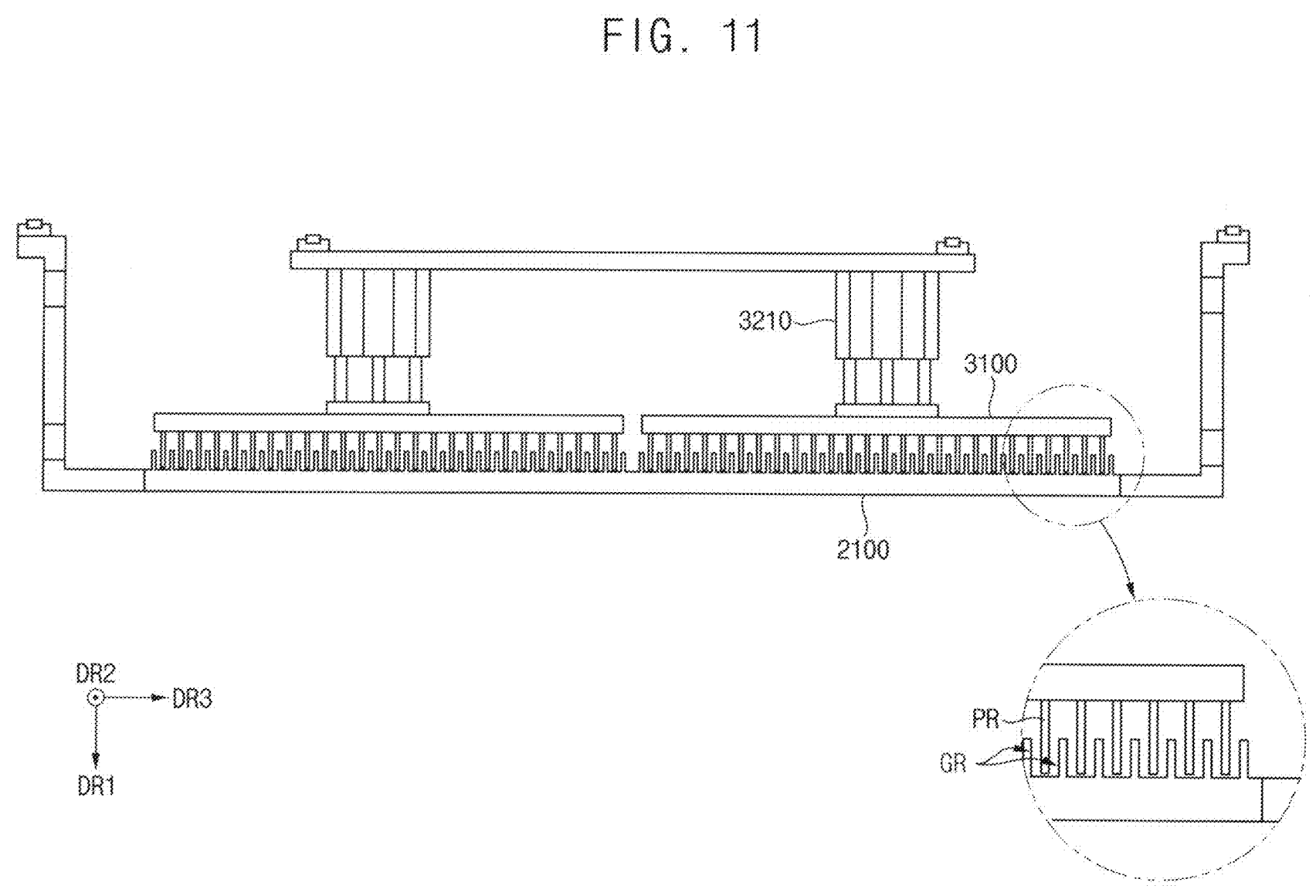

FIG. 11 is a diagram illustrating the plate part and the brush part included in the dummy panel transport apparatus of FIG. 2 as view from a second direction.

Referring to FIG. 11, in an embodiment, the plate 2100 may define a plurality of grooves GR recessed in the first direction DR1. The plurality of grooves GR may extend in the second direction DR2, and may be arranged in the third direction DR3. By the plurality of grooves GR, a contact area between the plate 2100 and the dummy panel DP accommodated on the plate 2100 may be relatively small.

In an embodiment, the brush unit 3100 may include a plurality of protrusion parts PR protruding in the first direction DR1, corresponding to the plurality of grooves GR. When the brush unit 3100 is moved in the first direction DR1 by the brush unit adjusting part 3210 so that the brush unit 3100 and the plate 2100 are adjacent to each other, the plurality of protrusion parts PR may be inserted into the plurality of grooves GR. Accordingly, after inserting the plurality of protrusion parts PR of the brush unit 3100 into the plurality of grooves GR of the plate 2100, and moving the brush unit 3100 in the direction opposite to the second direction DR2, the dummy panel DP accommodated on the plate 2100 may be effectively removed.

Figure 12:
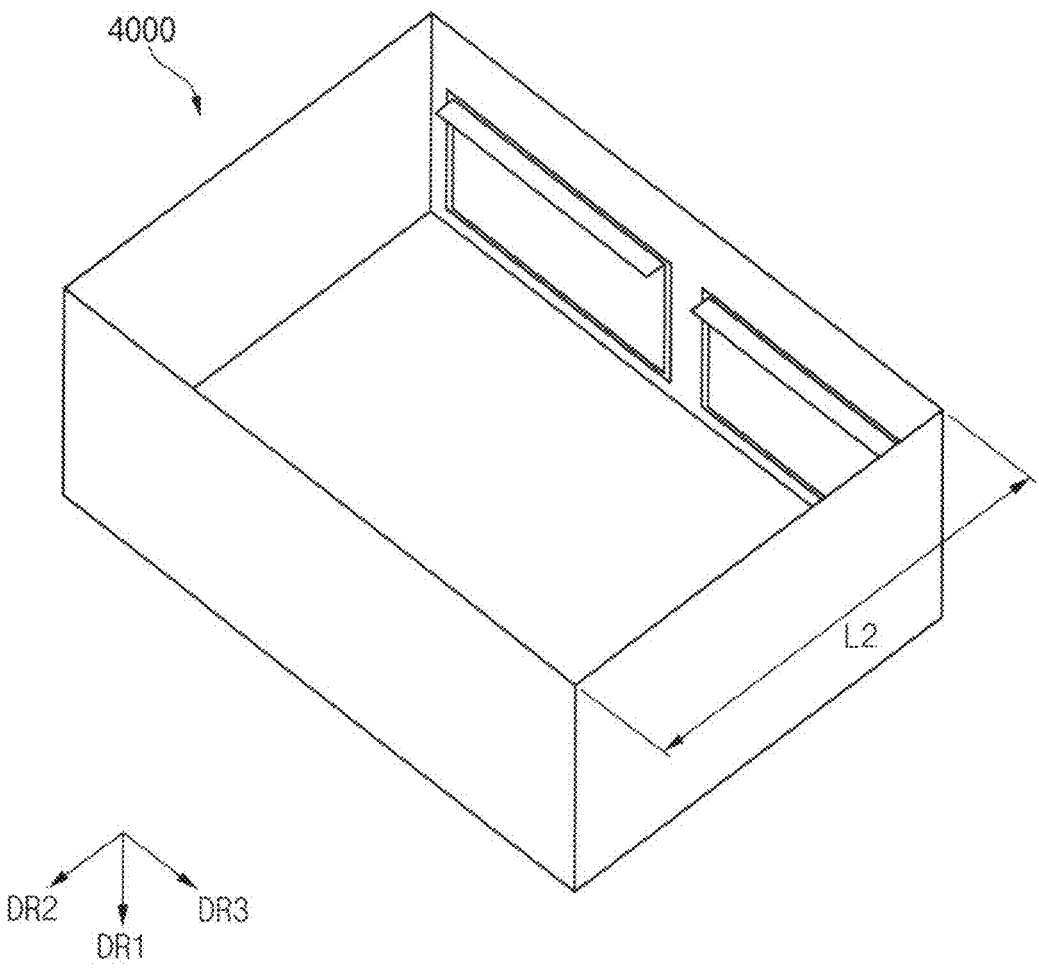
FIG. 12 is a perspective view illustrating a dummy storage part included in the dummy panel transport apparatus of FIG. 2.

FIG. 12 is a perspective view illustrating a dummy storage part included in the dummy panel transport apparatus of FIG. 2.

Referring to FIG. 12, the dummy storage part 4000 may have the inner space for accommodating the dummy panel DP. In an embodiment, a width L2 of the dummy storage part 4000 in the second direction DR2 may be larger than a width L1 of the plate 2100 in the second direction DR2.

FIG. 13, FIG. 14, FIG. 15, FIG. 16, FIG. 17, FIG. 18, and FIG. 19 are diagrams illustrating a dummy panel transport method using the dummy panel transport apparatus according to an embodiment.

Figure 13:
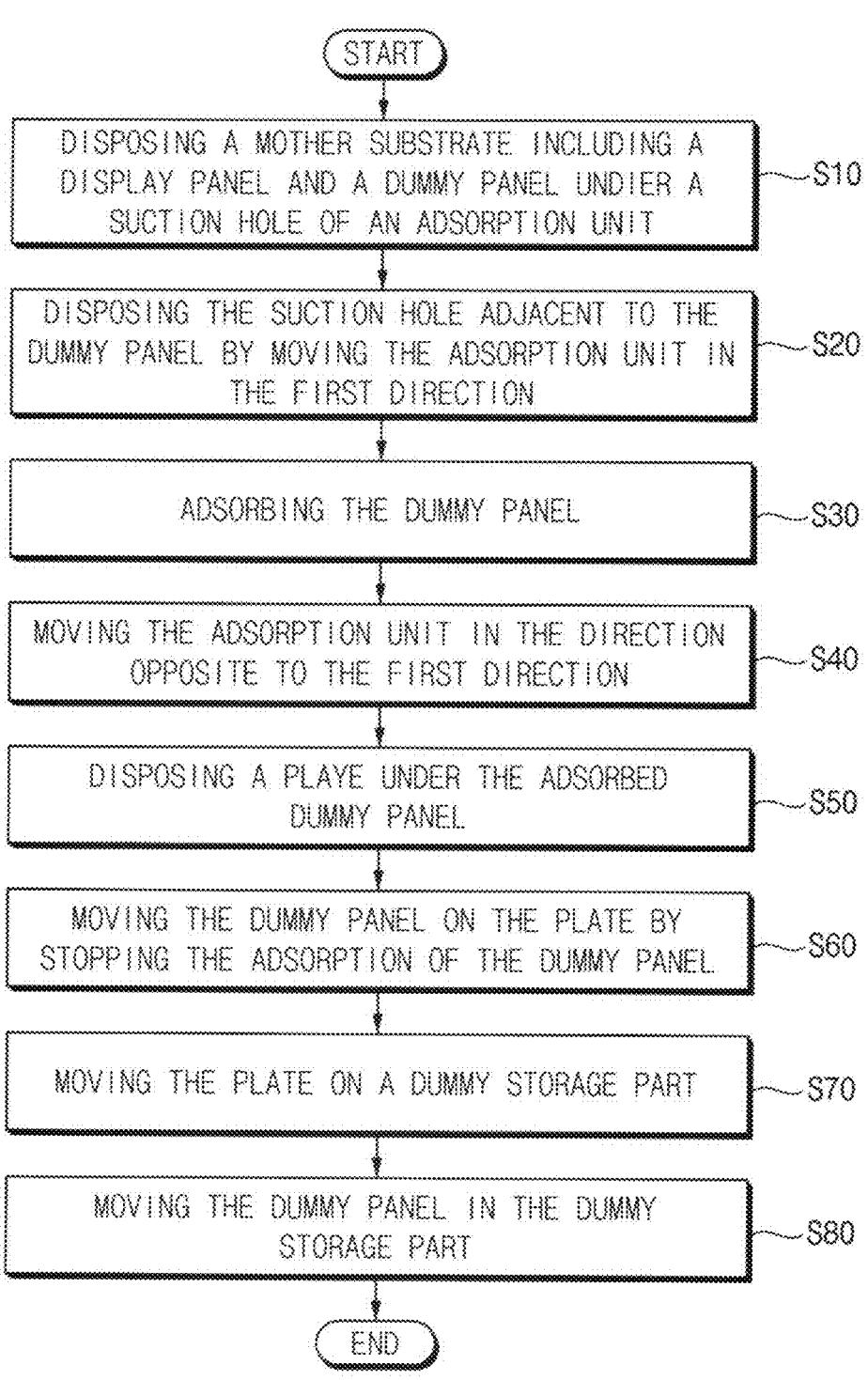
FIG. 13, FIG. 14, FIG. 15, FIG. 16, FIG. 17, FIG. 18, and FIG. 19 are diagrams illustrating a dummy panel transport method using the dummy panel transport apparatus according to an embodiment.

Referring to FIG. 13, a dummy panel transport method using the dummy panel transport apparatus DTA according to an embodiment may include: disposing the mother substrate SUB including the display panel PN and the dummy panel DP under the suction hole 1113 of the adsorption unit 1100 (S10), disposing the suction hole 1113 adjacent to the dummy panel DP by moving the adsorption unit 1100 in the first direction DR1 (S20), adsorbing the dummy panel DP (S30), moving the adsorption unit 1100 in the direction opposite to the first direction DR1 (S40), disposing the plate 2100 under the adsorbed dummy panel DP (S50), moving the dummy panel DP on the plate 2100 by stopping the adsorption of the dummy panel DP (S60), moving the plate 2100 on the dummy storage part 4000 (S70), and moving the dummy panel DP in the dummy storage part 4000 (S80).

Figure 14:
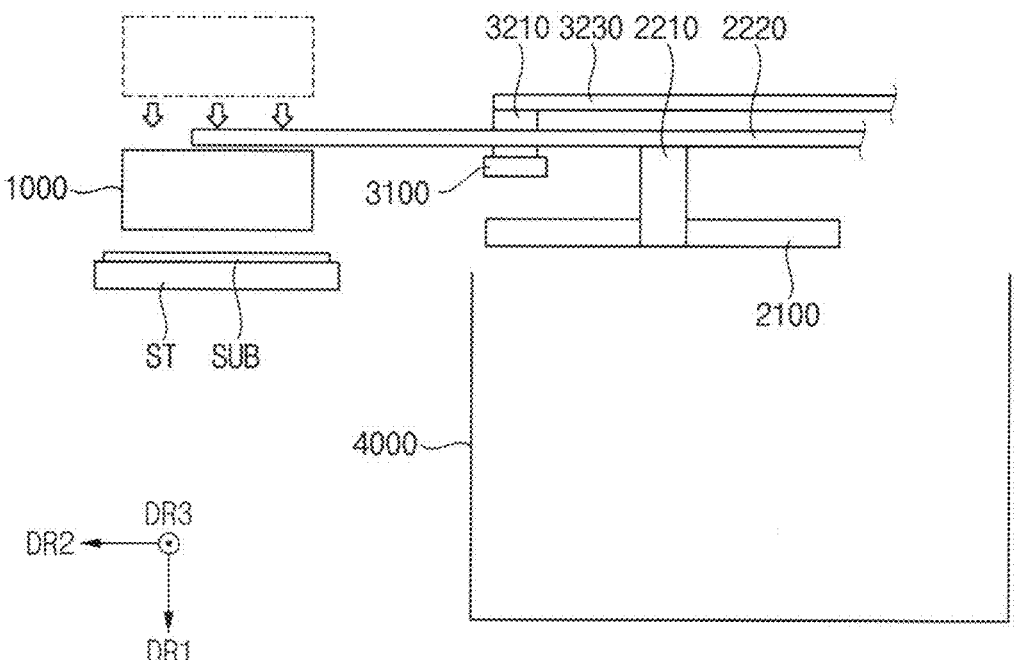

Referring to FIG. 14, a stage ST on which the mother substrate SUB is disposed may be disposed under the adsorption part 1000 (S10). In this case, the suction hole 1113 of the adsorption unit 1100 may face the dummy panel DP.

Figure 15:
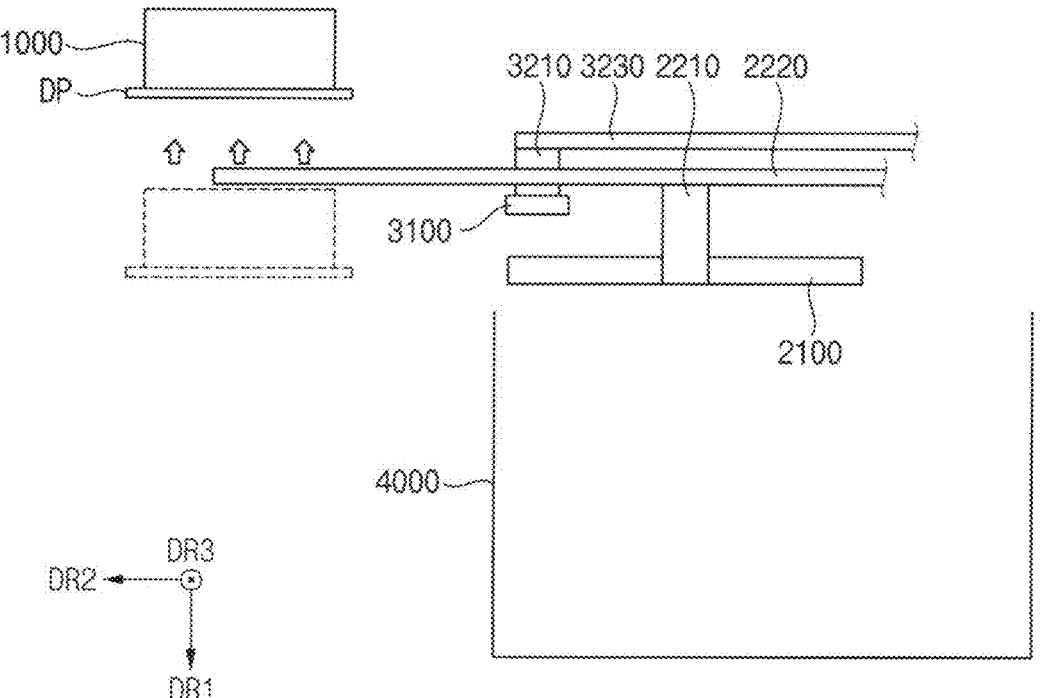

Referring to FIG. 14 and FIG. 15, the adsorption part 1000 may be moved in the first direction DR1 (e.g., downward in FIG. 14) (S20). Accordingly, the adsorption unit 1100 may be adjacent to the dummy panel DP. In this case, the adsorption unit 1100 may not directly contact the dummy panel DP and may be spaced apart from the dummy panel DP even though may be adjacent to the dummy panel DP.

After moving the adsorption part 1000 (S20), the compressed air having a relatively high pressure may be injected into the injection hole 1111 of the adsorption unit 1100. Accordingly, the suction hole 1113 may suck in external air, and the dummy panel DP may be adsorbed to the adsorption unit 1100 (S30).

After adsorbing the dummy panel DP (S30), the adsorption part 1000 including the adsorption unit 1100 may move in the direction (e.g., upward in FIG. 14) opposite to the first direction DR1 (S40).

Figure 16:
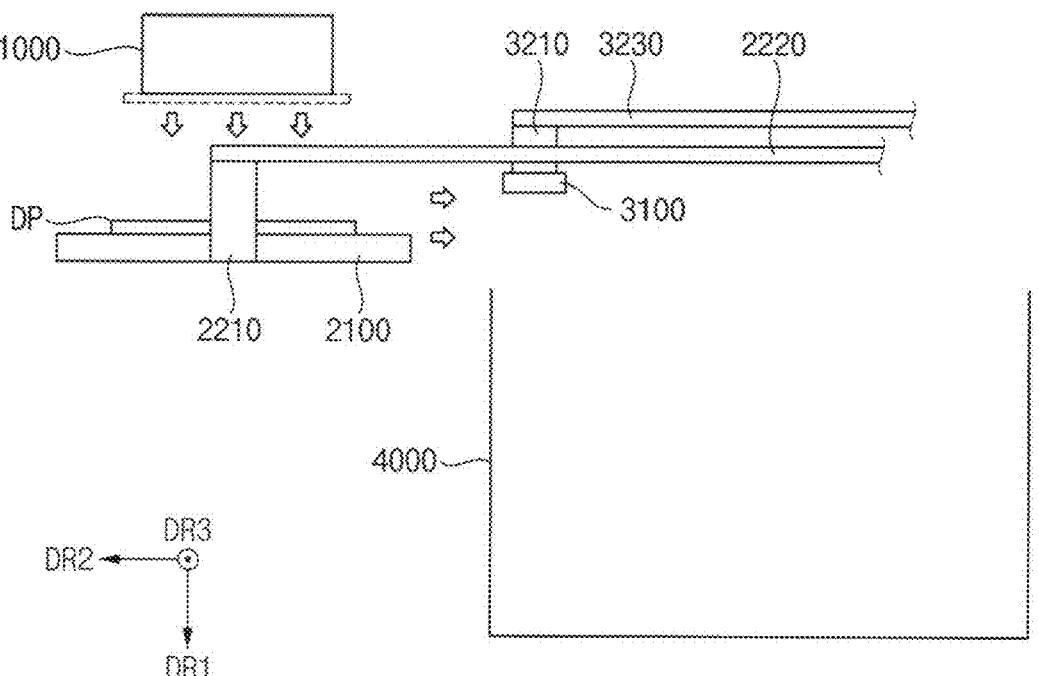
Figure 17:
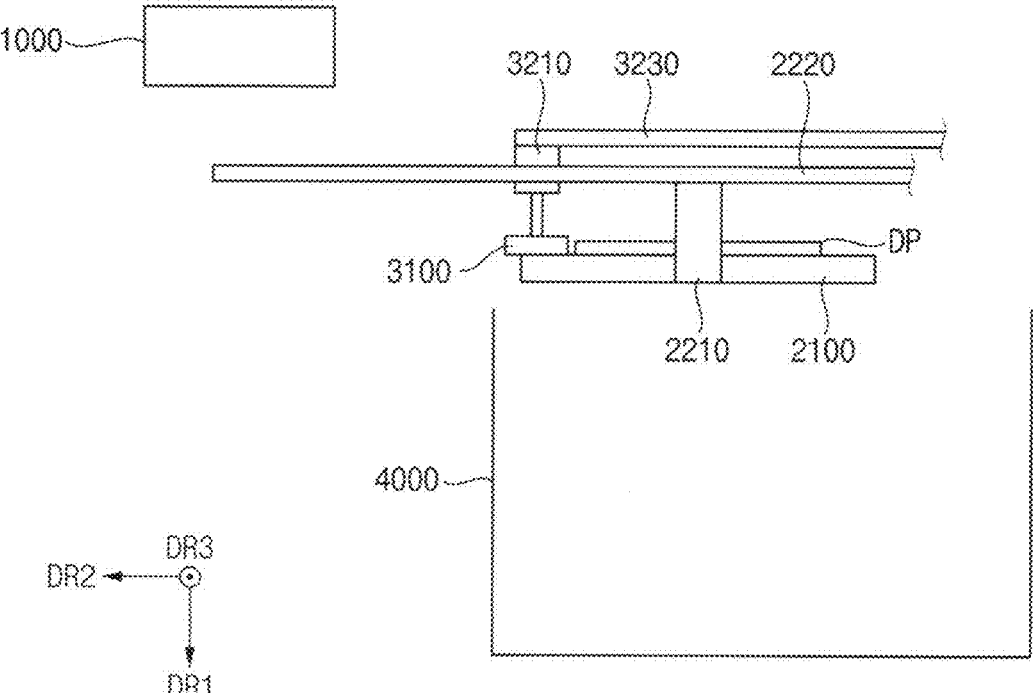

Referring to FIG. 15, FIG. 16, and FIG. 17, after moving the adsorption part 1000 including the adsorption unit 1100 (S40), the plate holding part 2210 may move in the second direction DR2 (e.g., left direction in FIG. 16) along the plate guide 2220 for disposing the plate 2100 and disposed under the adsorbed dummy panel DP (S50).

After disposing the plate 2100 (S50), the compressed air injection may be stopped. Accordingly, the dummy panel DP may move on the plate 2100 (S60).

After moving the dummy panel DP (S60), the plate 2100 may be moved on the dummy storage part 4000 by moving the plate holding part 2210 in the direction (e.g., right direction in FIG. 16) opposite to the second direction DR2 along the plate guide 2220 (S70).

11

Figure 18:
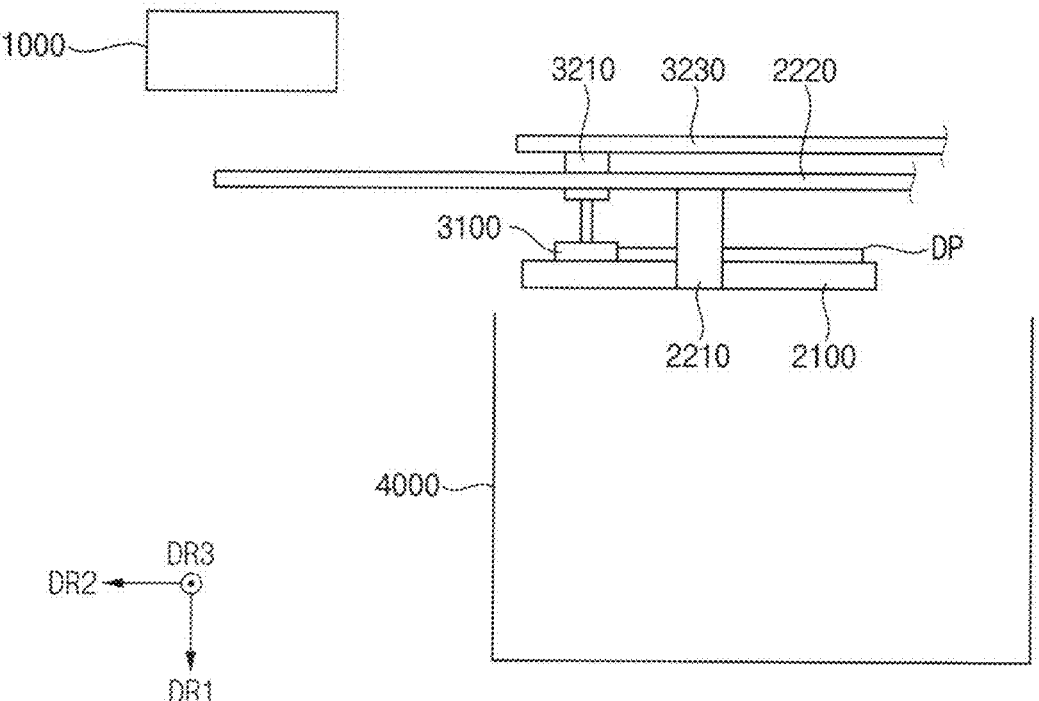
Figure 19:
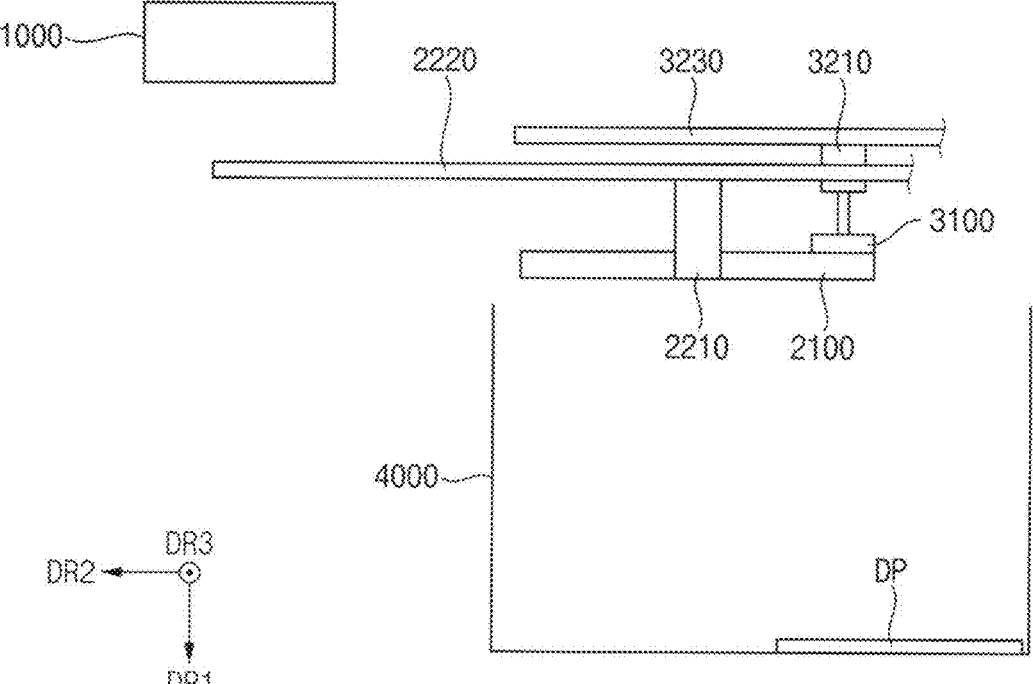

Referring to FIG. 17, FIG. 18, and FIG. 19, the dummy panel DP disposed on the plate 2100 may be moved in the dummy storage part 4000 (S80). In this case, moving the dummy panel DP (S80) may be performed simultaneously with moving the plate 2100 (S70), or may be performed after moving the plate 2100 (S70).

Specifically, moving the dummy panel DP (S80) may include moving the brush unit holder 3200 so that the brush unit 3100 is disposed on the plate 2100, moving the brush unit adjusting part 3210 in the first direction DR1 so that the brush unit 3100 is adjacent to the plate 2100, and pushing the dummy panel DP in the direction opposite to the second direction DR2 by moving the brush unit holding part 3220 in the direction (e.g., right direction in FIG. 18) opposite to the second direction DR2 along the brush unit guide part 3230.

In this case, in the moving the brush unit adjusting part 3210 in the first direction DR1, the plurality of protrusion parts PR formed in the brush unit 3100 may be inserted into the plurality of grooves GR defined in the plate 2100.

Although certain exemplary embodiments and implementations have been described herein, other embodiments and modifications will be apparent from this description. Accordingly, the inventions are not limited to such embodiments, but rather to the broader scope of the appended claims and various obvious modifications and equivalent arrangements as would be apparent to a person of ordinary skill in the art.

What is claimed is:

1. A dummy panel transport apparatus, comprising:
an adsorption unit comprising an injection hole into which compressed air is injected, a discharge hole to which the compressed air is discharged, and a suction hole in which an external air is sucked, wherein the injection hole is defined in a frame provided in a flow path between the discharge hole and the suction hole;
an adsorption unit holder, which supports the adsorption unit, and is movable in a first direction and a direction opposite to the first direction;
a plate disposed under the adsorption unit holder;
a plate holder, which supports the plate, and is movable in a second direction crossing the first direction and in a direction opposite to the second direction;
a dummy storage part disposed under the plate, and spaced apart from the adsorption unit holder in the direction opposite to the second direction;
a brush unit disposed on the plate; and
a brush unit holder, which supports the brush unit, and is movable in the first direction, in the direction opposite to the first direction, in the second direction, and in the direction opposite to the second direction.

2. The dummy panel transport apparatus of claim 1, wherein the frame has a first inner diameter in a first area adjacent to the injection hole, a second inner diameter in a second area adjacent to the discharge hole, and a third inner diameter in a third area between the first area and the second area,
wherein the third inner diameter is smaller than each of the first inner diameter and the second inner diameter.

3. The dummy panel transport apparatus of claim 2, wherein an inner diameter of the frame gradually changes from the first inner diameter to the third inner diameter, from the first area to the third area, and
the inner diameter of the frame gradually changes from the third inner diameter to the second inner diameter, from the third area to the second area.

4. The dummy panel transport apparatus of claim 2, wherein the frame has a fourth inner diameter in a fourth area adjacent to the suction hole, and a fifth inner diameter in a fifth area between the first area and the fourth area,
wherein the fifth inner diameter is smaller than each of the first inner diameter and the fourth inner diameter.

5. The dummy panel transport apparatus of claim 4, wherein an inner diameter of the frame gradually changes from the first inner diameter to the fifth inner diameter, from the first area to the fifth area.

6. The dummy panel transport apparatus of claim 4, wherein the fifth inner diameter is smaller than the third inner diameter.

7. The dummy panel transport apparatus of claim 1, wherein the adsorption unit further comprises an adsorption pad combined with the suction hole.

8. The dummy panel transport apparatus of claim 7, wherein an inner diameter of the adsorption pad gradually decreases in a direction toward the suction hole.

9. The dummy panel transport apparatus of claim 7, wherein an inner diameter of the adsorption pad adjacent to the suction hole is smaller than an inner diameter of the suction hole.

10. The dummy panel transport apparatus of claim 7, wherein Young's modulus of the adsorption pad is equal to or more than 0.01 gigapascals (GPa) and equal to or less than 5 GPa.

11. The dummy panel transport apparatus of claim 1, wherein the plate defines a plurality of grooves therein recessed in the first direction, extending in the second direction, and arranged in a third direction crossing the first direction and the second direction.

12. The dummy panel transport apparatus of claim 11, wherein the brush unit comprises a plurality of protrusion parts protruding in the first direction corresponding to the plurality of grooves.

13. The dummy panel transport apparatus of claim 1, wherein a width of the dummy storage part in the second direction is larger than a width of the plate in the second direction.

14. A dummy panel transport method, comprising:
disposing a display panel and a dummy panel adjacent to at least one side of the display panel under a suction hole of an adsorption unit, wherein the adsorption unit comprises an injection hole into which compressed air is injected, a discharge hole to which the compressed air is discharged, and the suction hole in which an external air is sucked, wherein the injection hole is defined in a frame provided in a flow path between the discharge hole and the suction hole;
disposing the suction hole adjacent to the dummy panel by moving an adsorption unit holder supporting the adsorption unit in a first direction;
adsorbing the dummy panel by injecting the compressed air into the injection hole;
moving the adsorption unit holed in a direction opposite to the first direction;
disposing a plate under the adsorbed dummy panel by moving a plate holder supporting the plate in a second direction crossing the first direction;
moving the dummy panel on the plate by stopping the adsorption of the dummy panel;
moving the plate on a dummy storage part by moving the plate holder in a direction opposite to the second direction; and
moving the dummy panel in the dummy storage part.

15. The dummy panel transport method of claim 14, wherein the moving of the dummy panel in the dummy storage part comprises:

moving a brush unit holder supporting a brush unit to dispose the brush unit on one side of the plate;

disposing the brush unit adjacent to the one side of the plate by moving the brush unit in the first direction; and pushing the dummy panel in the direction opposite to the second direction by moving the brush unit holder in the direction opposite to the second direction.

16. The dummy panel transport method of claim 15, wherein the plate defines a plurality of grooves therein recessed in the first direction, extending in the second direction, and arranged in a third direction crossing the first direction and the second direction, and the brush unit comprises a plurality of protrusion parts protruding in the first direction corresponding to the plurality of grooves.

17. The dummy panel transport method of claim 16, wherein in the disposing of the brush unit adjacent to the one side of the plate, the plurality of protrusion parts of the brush unit is inserted into the plurality of grooves of the plate.

18. The dummy panel transport method of claim 14, wherein the moving of the plate on the dummy storage part and the moving of the dummy panel in the dummy storage part are performed simultaneously.

19. The dummy panel transport method of claim 14, wherein in the disposing of the suction hole adjacent to the dummy panel, the dummy panel is spaced apart from the suction hole, and the suction hole is disposed to face the dummy panel.

20. The dummy panel transport method of claim 14, wherein the dummy panel is provided in plural, wherein in the adsorbing of the dummy panel by injecting the compressed air into the injection hole, the suction hole simultaneously adsorbs at least two of the dummy panels.

* * * * *